United States Patent [19]
Gormish et al.

[11] Patent Number: 5,912,636
[45] Date of Patent: Jun. 15, 1999

[54] APPARATUS AND METHOD FOR PERFORMING M-ARY FINITE STATE MACHINE ENTROPY CODING

[75] Inventors: Michael J. Gormish, Los Altos; Edward L. Schwartz, Sunnyvale, both of Calif.

[73] Assignees: Ricoh Company, Ltd., Tokyo, Japan; Ricoh Corporation, Menlo Park, Calif.

[21] Appl. No.: 08/719,819

[22] Filed: Sep. 26, 1996

[51] Int. Cl.$^6$ .................................................. H03M 7/00
[52] U.S. Cl. ............................................................. 341/50
[58] Field of Search .................................. 341/106, 107, 341/50, 58, 59, 67, 65

[56] References Cited

U.S. PATENT DOCUMENTS

| | | | |
|---|---|---|---|
| 4,286,256 | 8/1981 | Langdon, Jr. et al. | 341/107 |
| 4,413,251 | 11/1983 | Adler et al. | 340/347 |
| 4,467,317 | 8/1984 | Langdon, Jr. et al. | 341/107 |
| 4,646,061 | 2/1987 | Bledsoe | 340/347 |
| 4,891,643 | 1/1990 | Mitchell et al. | 341/107 |
| 4,933,883 | 6/1990 | Pennebaker et al. | 341/107 |
| 5,045,852 | 9/1991 | Mitchell et al. | 341/51 |
| 5,057,917 | 10/1991 | Shalkauser et al. | 358/135 |
| 5,059,976 | 10/1991 | Ono et al. | 341/107 |
| 5,272,478 | 12/1993 | Allen | 341/107 |
| 5,363,099 | 11/1994 | Allen | 341/107 |
| 5,475,388 | 12/1995 | Gormish et al. | 341/107 |

OTHER PUBLICATIONS

Howard, Paul G. and Vitter, Jeffrey Scott, "Practical Implementations of Arithmetic Coding", Image and Text Compression, Ed. James A. Storer, Kluwer Academic Publishers, (Boston), Apr. 1992, pp. 85–112.

Langdon, Glen G. Jr., "An Introduction to Arithmetic Coding", Mar. 1984, pp. 135–149.

Pennebacker, W.B., et al., "An Overview of the Basic Principles of the Q–Coder Adaptive Binary Arithmetic Coder", Nov. 1988, pp. 717–735.

GB Search Report, GB 9720231.1, Jan. 26, 1998, 3 pgs.

*Primary Examiner*—Brian K. Young
*Attorney, Agent, or Firm*—Blakely, Sokoloff, Taylor & Zafman LLP

[57] ABSTRACT

The present invention provides an encoding and/or decoding apparatus used for the compression and expansion of data. A finite state machine comprises a number of tables, which collectively have a plurality of states. One of the tables encodes multi-bit symbols for fixed probabilities.

74 Claims, 7 Drawing Sheets

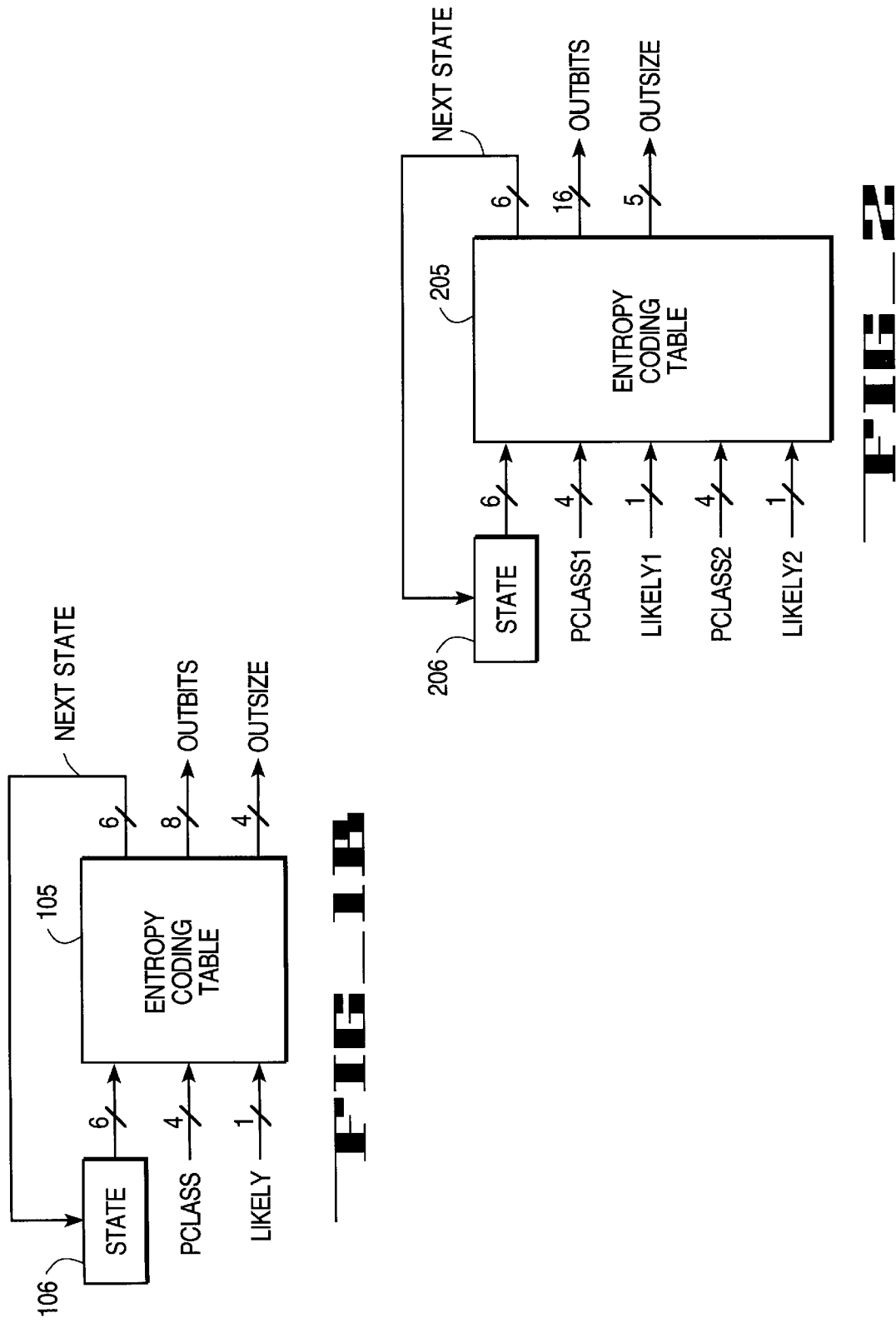

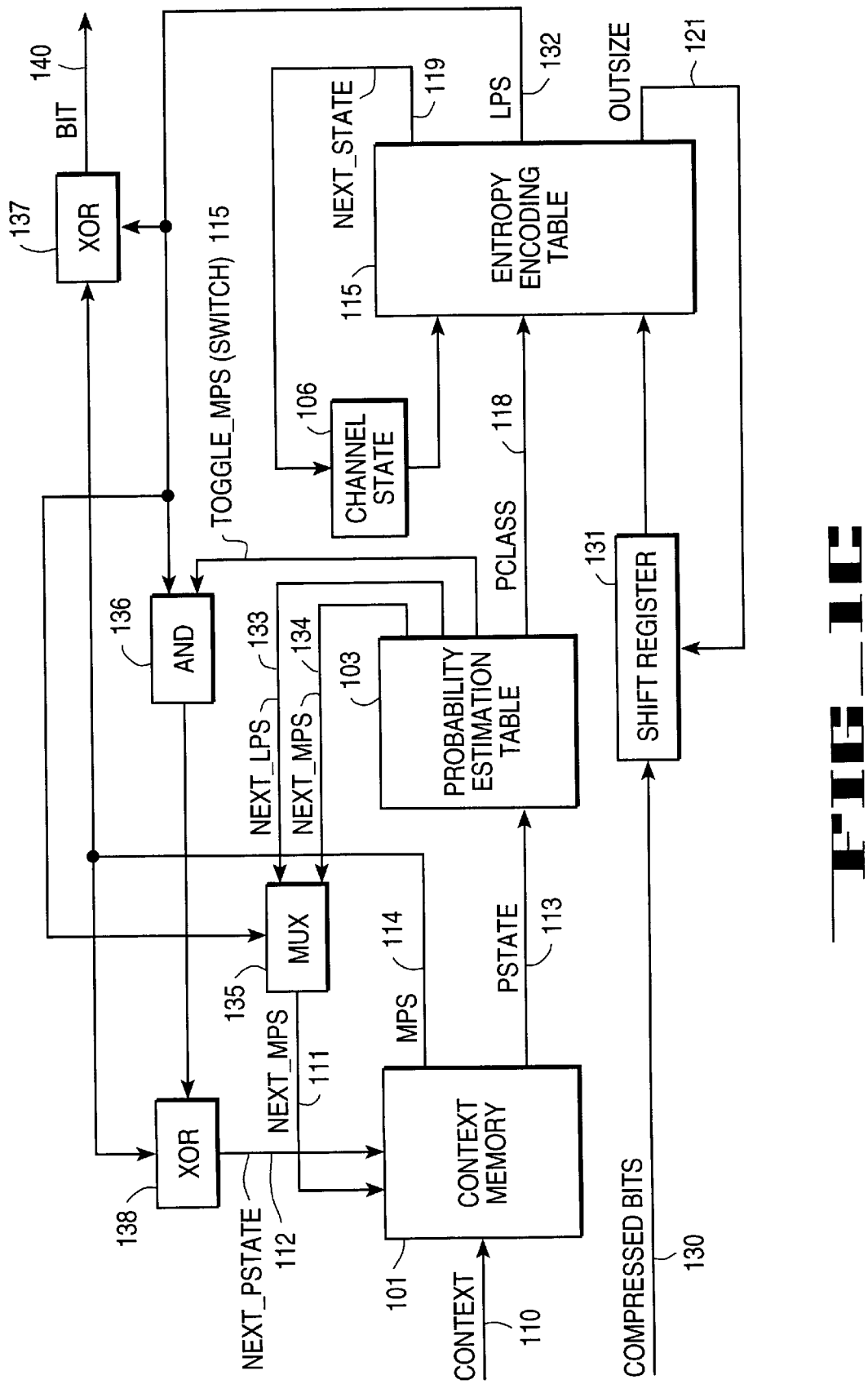
FIG_1C

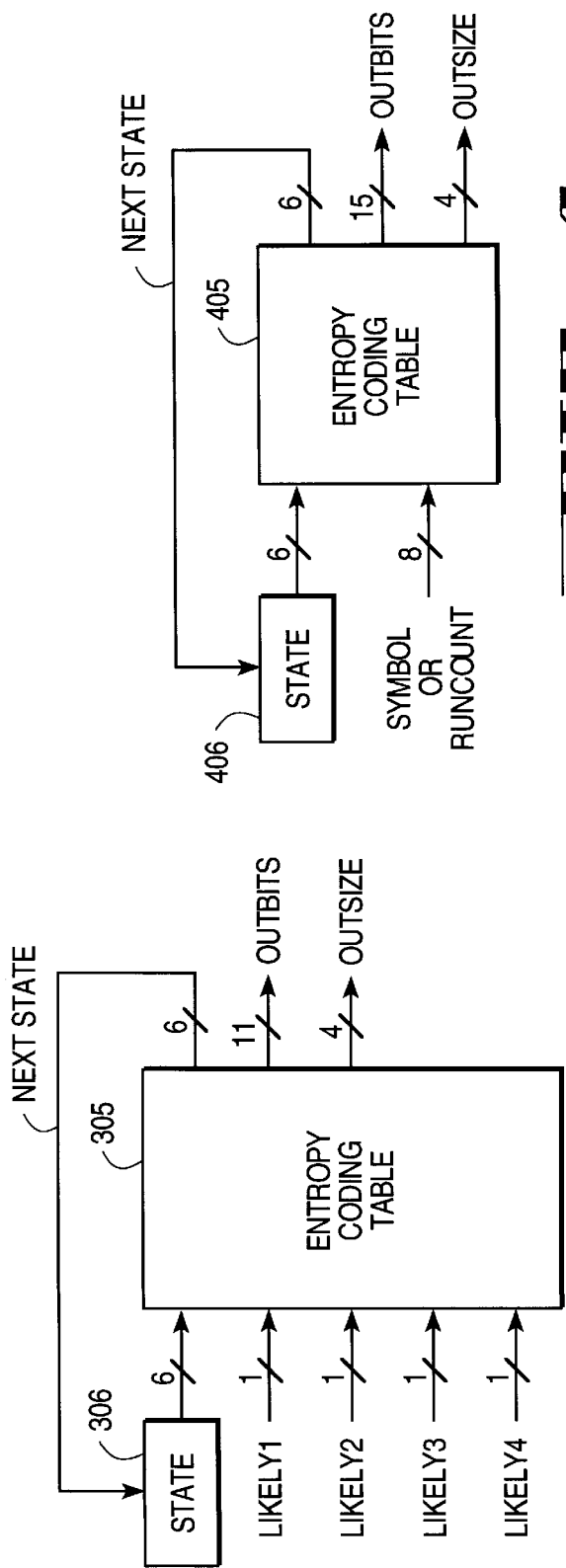
FIG_3
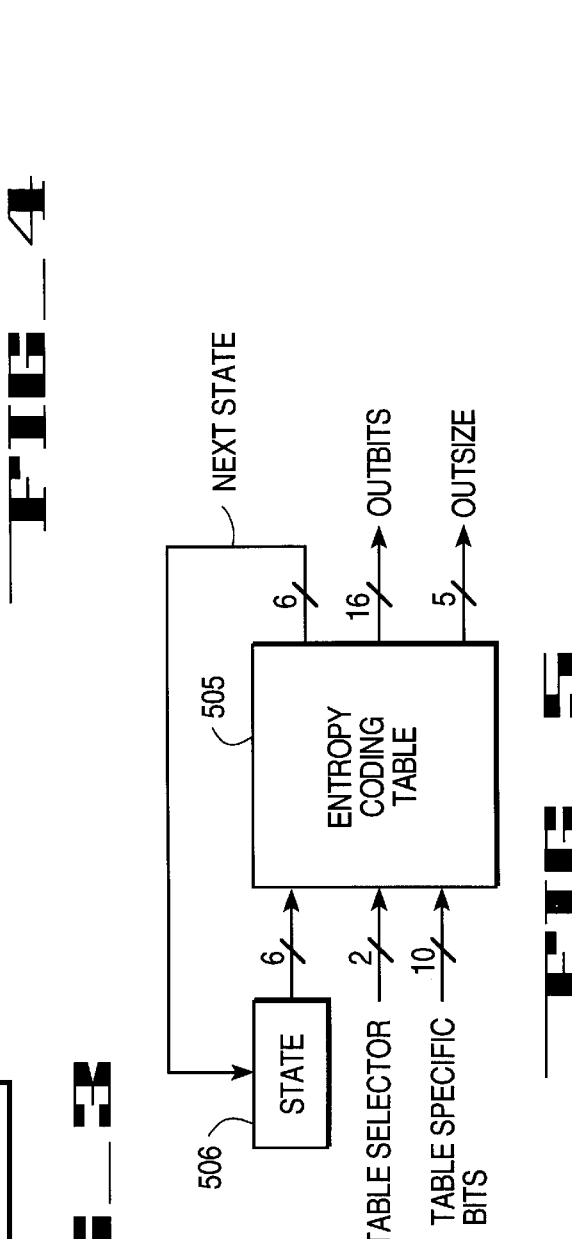
FIG_4
FIG_5

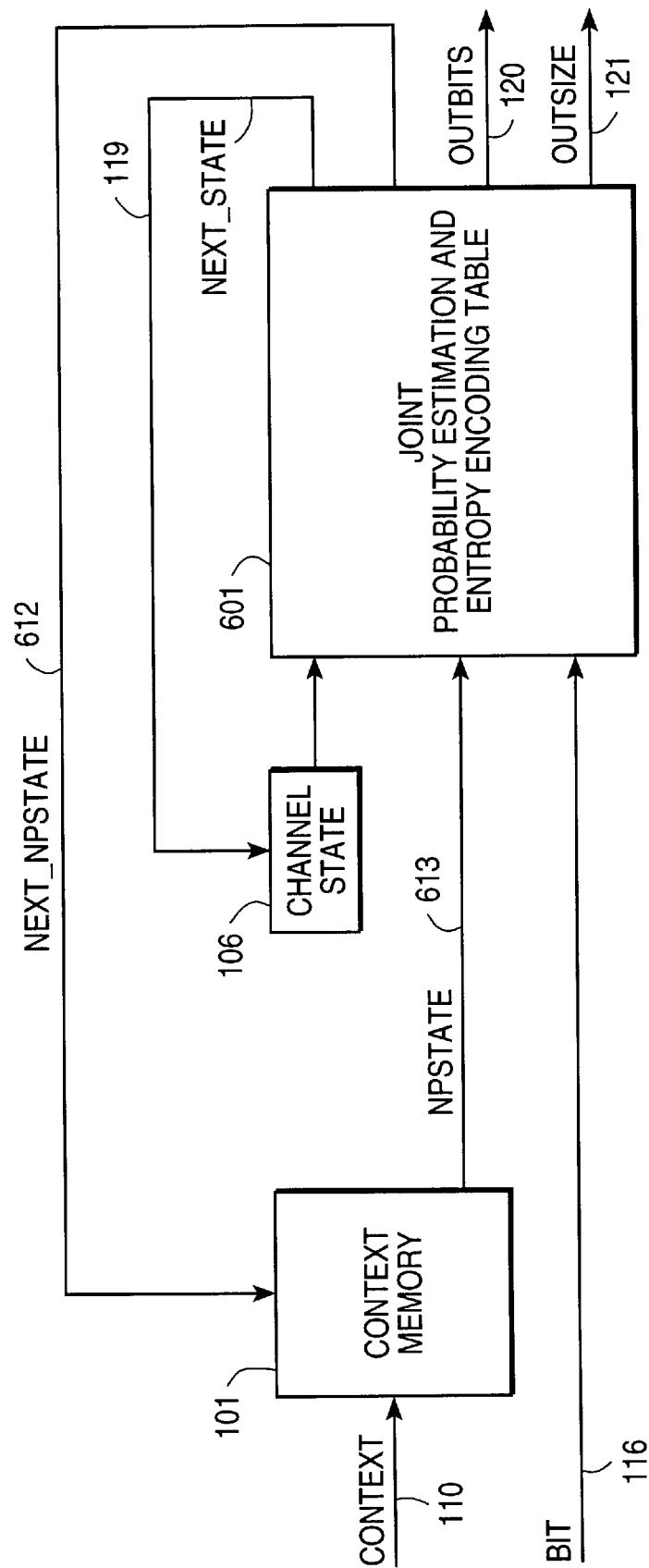
FIG_6

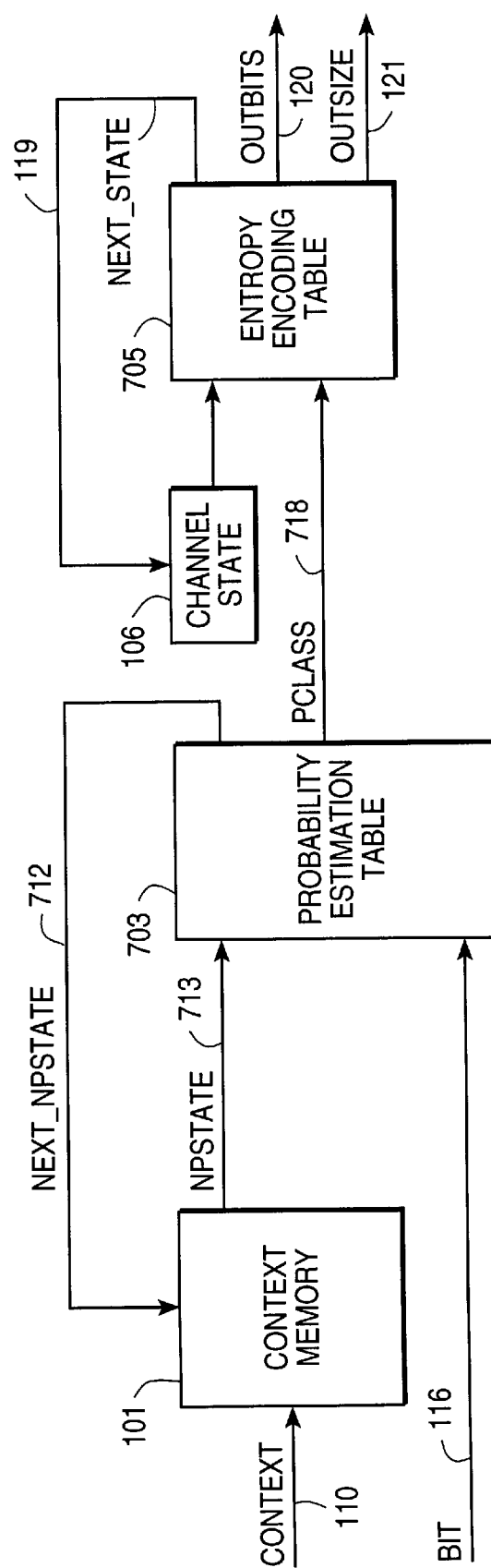
FIG_7

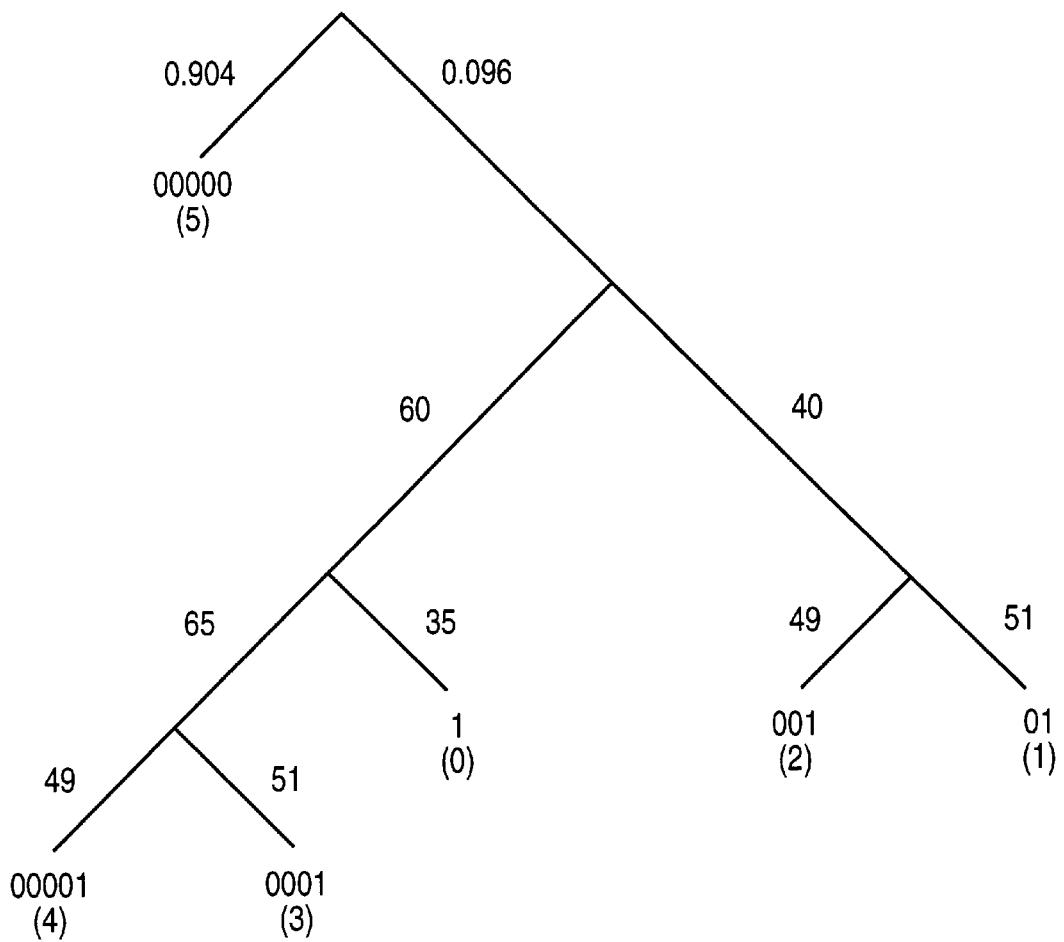
FIG_8

APPARATUS AND METHOD FOR PERFORMING M-ARY FINITE STATE MACHINE ENTROPY CODING

FIELD OF THE INVENTION

The present invention relates to the field of data compression and decompression systems; particularly, the present invention relates to finite state machine entropy coding of n-bits-at-a-time.

BACKGROUND OF THE INVENTION

Data compression is an extremely useful tool for storing and transmitting large amounts of data. For example, the time required to transmit an image, such as a facsimile transmission of a document, is reduced drastically when compression is used to decrease the number of bits required to recreate the image.

In some compression systems, an input file or set of data is translated into a sequence of decisions under the direction of a decision model. Each decision has an associated likelihood, and based on this likelihood, an output code is generated and appended to the compressed file. To implement these encoding systems, compression systems have three parts: a decision model, a probability estimation method and a bit-stream generator. The decision model receives the input data and translates the data into a set of decisions which the compression system uses to encode the data. The decision model is typically referred to as a context model. The probability estimation method is a procedure for developing the probability estimate for the likelihood of each decision. The bit-stream generator performs the final bit-stream encoding to generate the output code which is the compressed data set or compressed file. Compression can effectively occur in either or both the decision model and the bit generator.

One compression technique widely employed is arithmetic coding. Arithmetic coding maps a string of data (i.e., a "message") to a code string in such a way that the original message can be recovered from the code string. For a discussion on arithmetic coding, see Glenn G. Langdon, Jr., "An Introduction to Arithmetic Coding," *IBM Journal of Research and Development*, vol. 28, no. 2 (March 1984). One desirable feature of some prior arithmetic coding systems is that compression is performed in a single sequential pass over the data without a fixed set of statistics to code the data. In this manner, arithmetic coding is adaptive.

A binary arithmetic coder is one type of arithmetic coding system. In a binary arithmetic coding system, the selection of a symbol from a set of symbols can be encoded as a sequence of binary decisions. An example of a binary arithmetic coder is the Q-coder developed by IBM of Armonk, N.Y.

Finite state machine (FSM) coders have been used in the prior art to provide efficient entropy coding for single bits with an associated probability estimate. Some of these FSM coders have been implemented as look-up tables (LUTs). For example, see U.S. Pat. Nos. 5,272,478 and 5,363,099. For an example of a finite state machine that performs channel modulation and error correction with entropy coding, see U.S. Pat. No. 5,475,388.

Generally, finite state machines using LUTs are not fast for multi-bit symbols. For instance, if a number between 0 and 7 inclusive is to be coded, the number must be separated into a minimum of three bits, thereby requiring three separate table look-ups. The cumulative effort of the three separate look-ups is to slow down the encoding process. What is needed is to be able to avoid multiple table lookups while encoding multi-bit symbols.

Huffman coding provides for m-ary coding in which a multi-symbol is encoded and/or decoded. Huffman coding creates variable length codes that are in integral (non-fractional) number of bits. In other words, there is no time when the encoder contains information which effects some of the bits that have yet to be output. Symbols with higher probabilities get shorter codes.

Data encoding and decoding are very time intensive operations. In many systems, the probability estimation is performed using a table. When both the probability estimation and entropy encoding are implemented as LUTs, separate look-ups are required, without parallelism. It is desirable to avoid separate table look-ups if possible to reduce the amount of time to perform the probability estimation and entropy coding of the prior art.

In the prior art, entropy coding has typically been performed fast, but without the best compression via, for instance, Huffman coding, or have been fully adaptive, yet slower via, for instance, arithmetic coding. It is desirable to speed up such operations while remaining adaptive.

The present invention provides increased speed for entropy coding using a finite state machine coder that is capable of accommodating n-bit inputs. The present invention further provides coding of m-ary symbols like Huffman coding except with a non-integral (fractional) number of bits. The present invention also provides one-table look-up for both probability estimation and bit generation rather than two separate operations.

SUMMARY OF THE INVENTION

An m-ary finite state machine coder is described. In one embodiment, the encoder of the present invention comprises a channel state storage device and an entropy encoding look-up table, which receives state information from the channel state storage device. The entropy encoding table encodes n-bits of input data at a time in response to the state information from the channel state storage device, where $n \geq 2$.

BRIEF DESCRIPTION OF THE DRAWINGS

The present invention will be understood more fully from the detailed description given below and from the accompanying drawings of various embodiments of the invention, which, however, should not be taken to limit the invention to the specific embodiments, but are for explanation and understanding only.

FIG. 1B illustrates one embodiment of the FSM encoder.

FIG. 1C illustrates a finite state machine estimator/decoder.

FIG. 2 illustrates one embodiment of a 2-bit-at-a-time FSM encoder capable of handling any probabilities.

FIG. 3 illustrates a 4-bit-at-a-time FSM encoder designed for bits of the same probability class.

FIG. 4 illustrates one embodiment of a multi-symbol (M-ary) FSM encoder.

FIG. 5 illustrates an encoder capable of performing the same operation as FIG. 1A, FIG. 3, and FIG. 4 by using 2 additional bits as a table selector.

FIG. 6 illustrates one embodiment of a one table estimation and coding system.

FIG. 7 illustrates one embodiment of a finite state machine estimator/coder in which the probability estimation state contains the most probable symbol (MPS).

FIG. 8 shows a coding tree generated by the Huffman algorithm for a particular set of symbols.

DETAILED DESCRIPTION OF THE INVENTION

Figure 1A:
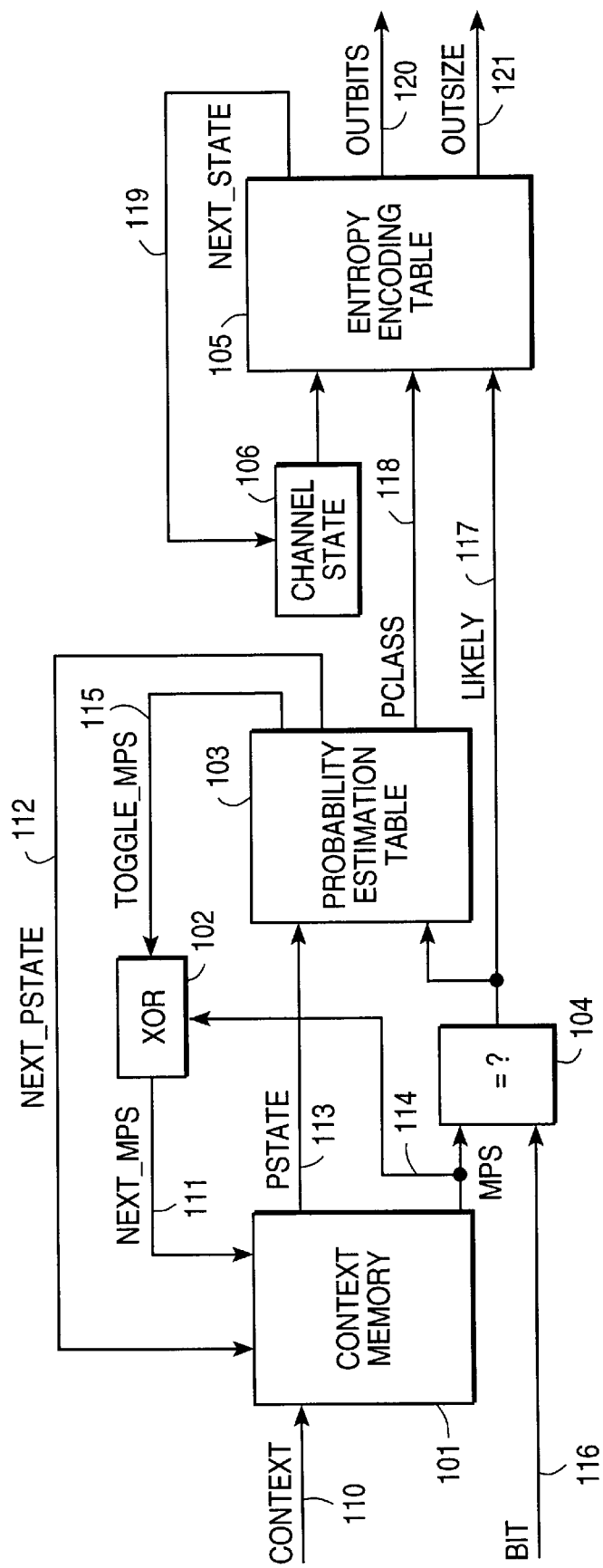
FIG. 1A illustrates a finite state machine estimator/coder.

A method and apparatus for compression and decompression is described. In the following detailed description of the present invention numerous specific details are set forth, such as types of coders, numbers of bits, signal names, etc., in order to provide a thorough understanding of the present invention. However, it will be apparent to one skilled in the art that the present invention may be practiced without these specific details. In other instances, well-known structures and devices are shown in block diagram form, rather than in detail, in order to avoid obscuring the present invention.

Some portions of the detailed descriptions which follow are presented in terms of algorithms and symbolic representations of operations on data bits within a computer memory. These algorithmic descriptions and representations are the means used by those skilled in the data processing arts to most effectively convey the substance of their work to others skilled in the art. An algorithm is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the following discussions, it is appreciated that throughout the present invention, discussions utilizing terms such as "processing" or "computing" or "calculating" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices. Such computer systems typically employ one or more processors to process data, which are coupled to one or more memories via one or more buses.

The present invention also relates to apparatus for performing the operations herein. This apparatus may be specially constructed for the required purposes, or it may comprise a general purpose computer selectively activated or reconfigured by a computer program stored in the computer. Such a computer program may be stored in a computer readable storage medium, such as, but is not limited to, any type of disk including floppy disks, optical disks, CD-ROMs, and magneto-optical disks, read-only memories (ROMs), random access memories (RAMs), EPROMs, EEPROMs, magnet or optical cards, or any type of media suitable for storing electronic instructions, and each coupled to a computer system bus. The algorithms and displays presented herein are not inherently related to any particular computer or other apparatus. Various general purpose machines may be used with programs in accordance with the teachings herein, or it may prove convenient to construct more specialized apparatus to perform the required method steps. The required structure for a variety of these machines will appear from the description below. In addition, the present invention is not described with reference to any particular programming language. It will be appreciated that a variety of programming languages may be used to implement the teachings of the invention as described herein.

Overview of the Present Invention

The present invention provides for speeding up a finite state machine coder by coding n bits at a time. In other words, the present invention provides for encoding M-symbol alphabets (where M>=2) using a finite state machine coder. The encoding of M-symbol alphabets results in increased speed and increased compression performance. The present invention also performs run coding, Huffman coding, and other multi-symbol codes with a FSM coder. The combination of the FSM coder with the multi-symbol codes provides both the speed of the multi-symbol codes and the compression performance typically possible only with arithmetic codes.

The FSM coder of the present invention may use multiple look-up tables (LUTs). Each LUT is created for use in a particular situation. For instance, as described in more detail below, one of the tables may be designed for use with the least significant bits of wavelet coefficients which are typically fifty percent 1's and fifty percent 0's. Each of the tables is used to perform different types of coding on the same bitstream. The present invention uses the coder by switching back and forth between these tables during coding, while maintaining fractional bits in the bitstream.

In the prior art, the FSM-based coder system may use three tables. The first of the tables contains the current probability estimate and most probable symbol (MPS) value for each context for which estimation is performed. The entries in this table are changed with each symbol coded in a context. A second table provides the probability estimate updates. This table doesn't change and updates entries in the context table. The third table is the set of states describing legal outputs to the bit stream. This table doesn't change and updates the current state variable for the coder. This table also indicates what bits should be output.

The decoder uses the same tables for storing probability estimates and updating probability estimates, but uses a different table for coding. The third table in the decoder looks up input bits and probability estimates and determines whether the MPS occurred, determines the next state, and determines the number of bits by which to shift the input stream to prepare for the next decoding operation. One embodiment of the sizes and structures of these tables are given in Table 1 below.

TABLE 1

| Table | Inputs | Outputs | Address Width in Bits | Minimum memory width in bits |
|---|---|---|---|---|
| Context Estimation | Context Pstate, MPS | Pstate, MPS Pclass, next_pstate, toggle_mps | 10 11 | 10 15 |
| Coder | Cstate, Pclass, MPS | newCstate, outbits, outsize | 11 | 18 |
| Decoder | Cstate, Bits, Pclass | MPS, outsize, newCstate | 18 | 11 |

FIG. 1A is a block diagram one embodiment of a two table finite state machine estimator/coder illustrating connections between the tables therein. Referring to FIG. 1A, a context memory 101, which stores the current probability estimate and MPS value for each context for which estimation is performed, is coupled to receive a context 110, a next_mps indication 111 from exclusive-OR (XOR) 102, and a next_pstate indication 112. The next_mps indication 111 provides an indication to the context memory 101 as to what the next MPS is. That is, the next_mps indication 111 indicates whether the MPS has changed. The next_pstate indication 112 provides an indication to the context memory 101 as to what the next probability estimation state is. Based on these inputs, the context memory 101 is accessed and outputs the current probability state (pstate) 113 and the current MPS 114.

The current MPS 114 is coupled to one input of XOR gate 102. The other input of XOR gate 102 is coupled to an output, toggle_mps 115, of the probability estimation table 102. In one embodiment, if the toggle_mps 115 signal is "1" and the value of the pstate 113 is less than 215 or there is an output (outsize 122>0), then the value of the MPS stored in context memory 101 is changed from "0" to "1" or from "1" to "0".

A comparator block 104 is coupled to receive the current MPS 114 and compares the current MPS 114 to the input bit 116. If the outcome of the comparison indicates that the MPS 114 is equal to the input bit 116, a "likely" indication 117 is asserted. If the outcome of the comparison indicates that the MPS 114 is not equal to the input bit 116, the "likely" indication 117 is not asserted.

The probability estimation table 103 is coupled to receive the pstate 113 and the likely indication 117 and, based on these inputs, outputs a probability class (pclass) 118, the toggle_mps 115, and the next_pstate indication 112. The toggle_mps 115 indicates whether the MPS should be changed from 1 to 0 or vice versa. The actual probability estimate is represented by a class, referred to herein as PClass. Each PClass is used for a range of probabilities. In one embodiment, each PClass is used for a range of probabilities instead of using several bits to specify an exact probability. In this manner, only a few bits are needed to specify which class range the probability is in. In one embodiment, four bits are used to the PClass.

One embodiment of the probability estimation table 103 is shown in Table 2 below:

TABLE 2

Entry PEM

| PSTATE | Likely | PCLASS | NEXT PSTATE | TOGGLE_MPS |
|---|---|---|---|---|
| 0 | 0 | 0 | 1 | 1 |
| 0 | 1 | 0 | 1 | 0 |
| 1 | 0 | 0 | 0 | 0 |
| 1 | 1 | 0 | 2 | 0 |
| 2 | 0 | 1 | 1 | 0 |
| 2 | 1 | 1 | 3 | 0 |
| 3 | 0 | 1 | 2 | 0 |
| 3 | 1 | 1 | 3 | 0 |

The entropy encoding table 105 representing a finite state machine is coupled to receive the pclass 118, the likely indication 117, and an output of channel state 106 and produces 0 or more output bits as the compressed bitstream. The channel state 106 stores fractional bits representing the current state in which the output channel is. In one embodiment, the channel state 106 comprises a register or other storage element storing state information. In one embodiment, the channel state 106 stores six bits of channel information. The output of the channel state 106 occurs in response to a next state indication, next_state 119, output from the entropy encoding table 105.

Based on its inputs, the entropy encoding table 105 outputs one or more bits as the compressed bitstream, referred to herein as outbits 121, and an indication of the number of bits in the output, referred to herein as outsize 122. Note that the outsize 122 may only be an indicator as to which bits in the output stream are significant. The entropy encoding table 105 also generates one or more bits to indicate the next state referred to as next_state 119. The next_state 119 is fed back to channel state 106 as the state input for the next bit(s).

In one embodiment, the entropy encoding table 105 comprises a look-up table (LUT) having multiple states, with each of the states having one or more pairs of legal transitions. Each transition is defined to cause a storing of zero or more bits to be omitted when the transition occurs and a destination state to which the transition transfers during transition. It is from this destination state that the LUTs continue processing the next symbol.

FIG. 1B illustrates one embodiment of the FSM coder. Referring to FIG. 1B, the entropy coding look-up table 105 is coupled to receive six bits of state information from state register 106, four bits representing the PClass, and one bit providing a likely indication. In response, the entropy coding look-up table 105 provides 8 bits of output (OUTBITS), four bits to indicate output size (OUTSIZE), and 6 bits to indicate the next state.

A set of buffers may be used to buffer the outbits 121. These buffers are not shown to avoid obscuring the present invention.

One embodiment of the probability estimation and FSM encoder tables used to perform the entropy coding are shown in Table 3 and 4 below. Table 3 shows an excerpt of the probability estimation table, while Table 4 give excerpts from the FSM encoder table.

TABLE 3

Excerpts of the Probability Estimation Table

| PSTATE | PCLASS | NEXT PSTATE on MPS | NEXT PSTATE on LPS | SWTCH |
|---|---|---|---|---|
| 0 | 0 | 5 | 5 | 1 |
| 1 | 0 | 6 | 4 | 1 |
| 2 | 0 | 7 | 3 | 1 |
| 3 | 0 | 8 | 2 | 1 |
| 4 | 0 | 9 | 1 | 1 |
| 5 | 0 | 10 | 0 | 0 |
| 6 | 0 | 11 | 1 | 0 |
| 7 | 0 | 12 | 2 | 0 |
| 8 | 0 | 13 | 3 | 0 |
| 9 | 0 | 14 | 4 | 0 |
| 10 | 0 | 15 | 5 | 0 |
| 11 | 0 | 16 | 6 | 0 |
| 12 | 0 | 17 | 7 | 0 |
| 13 | 0 | 18 | 8 | 0 |
| 14 | 0 | 19 | 10 | 0 |
| 15 | 0 | 20 | 10 | 0 |
| 16 | 0 | 21 | 11 | 0 |
| 17 | 0 | 22 | 12 | 0 |
| 18 | 0 | 23 | 13 | 0 |
| 19 | 0 | 24 | 14 | 0 |
| 20 | 0 | 25 | 15 | 0 |
| 21 | 0 | 26 | 16 | 0 |
| 22 | 0 | 27 | 17 | 0 |
| 23 | 0 | 28 | 18 | 0 |
| 24 | 0 | 29 | 19 | 0 |
| 25 | 0 | 30 | 20 | 0 |
| 26 | 0 | 31 | 21 | 0 |
| 27 | 0 | 32 | 22 | 0 |
| 28 | 0 | 33 | 23 | 0 |
| 29 | 0 | 34 | 24 | 0 |
| 30 | 0 | 35 | 25 | 0 |
| 31 | 0 | 36 | 26 | 0 |
| 32 | 0 | 37 | 27 | 0 |
| 33 | 0 | 38 | 28 | 0 |
| 34 | 0 | 38 | 29 | 0 |
| 35 | 0 | 39 | 30 | 0 |

TABLE 3-continued

Excerpts of the Probability Estimation Table

| PSTATE | PCLASS | NEXT PSTATE on MPS | NEXT PSTATE on LPS | SWTCH |
|---|---|---|---|---|
| 36 | 0 | 40 | 31 | 0 |
| 37 | 0 | 41 | 32 | 0 |
| 38 | 0 | 42 | 33 | 0 |
| 39 | 0 | 43 | 34 | 0 |
| 40 | 0 | 44 | 35 | 0 |
| 41 | 0 | 45 | 36 | 0 |
| 42 | 0 | 46 | 37 | 0 |
| 43 | 0 | 47 | 38 | 0 |
| 44 | 0 | 48 | 39 | 0 |
| 45 | 0 | 49 | 40 | 0 |
| 46 | 0 | 50 | 41 | 0 |
| 47 | 0 | 51 | 42 | 0 |
| 48 | 0 | 52 | 42 | 0 |
| 49 | 0 | 53 | 43 | 0 |
| 50 | 0 | 54 | 44 | 0 |
| 51 | 0 | 55 | 45 | 0 |
| 52 | 0 | 56 | 46 | 0 |
| 53 | 0 | 57 | 47 | 0 |
| 54 | 0 | 58 | 48 | 0 |
| 55 | 0 | 59 | 49 | 0 |
| 56 | 0 | 60 | 50 | 0 |
| 57 | 0 | 61 | 51 | 0 |
| 58 | 0 | 62 | 52 | 0 |
| 59 | 0 | 63 | 53 | 0 |
| 60 | 0 | 64 | 54 | 0 |
| 61 | 1 | 65 | 55 | 0 |
| 62 | 1 | 66 | 55 | 0 |
| 63 | 1 | 67 | 57 | 0 |

Table 4 shows only the first and last few rows and is ordered by state, probability class, and LPS/MPS. Each entry in the table is triple (next state, output, output bits). The third element identifies the number of output bits that should be added to the compressed output stream, which allows 0 and 00 to be distinguished.

TABLE 4

Excerpts from the Encoder Table

| Inputs | | ON LPS | | | ON MPS | | |
|---|---|---|---|---|---|---|---|
| State | Pclass | next_state | outbits | outsize | next_state | outbits | outsize |
| 0 | 0 | 0 | 0 | 1 | 0 | 1 | 1 |
| 0 | 1 | 9 | 1 | 1 | 3 | 0 | 0 |
| 0 | 2 | 9 | 1 | 1 | 3 | 0 | 0 |
| 0 | 3 | 41 | 1 | 1 | 5 | 0 | 0 |
| 0 | 4 | 0 | 3 | 2 | 1 | 0 | 0 |
| 0 | 5 | 0 | 3 | 2 | 1 | 0 | 0 |
| 0 | 6 | 0 | 3 | 2 | 1 | 0 | 0 |
| 0 | 7 | 9 | 3 | 2 | 8 | 0 | 0 |
| 0 | 8 | 0 | 7 | 3 | 2 | 0 | 0 |
| 0 | 9 | 0 | 7 | 3 | 2 | 0 | 0 |
| 0 | 10 | 9 | 7 | 3 | 55 | 0 | 0 |
| 0 | 11 | 0 | 15 | 4 | 4 | 0 | 0 |
| 0 | 12 | 0 | 31 | 5 | 6 | 0 | 0 |
| 0 | 13 | 0 | 63 | 6 | 16 | 0 | 0 |
| 0 | 14 | 0 | 127 | 7 | 27 | 0 | 0 |
| 0 | 15 | 0 | 255 | 8 | 56 | 0 | 0 |
| 1 | 0 | 17 | 0 | 0 | 2 | 0 | 1 |
| 1 | 1 | 17 | 0 | 0 | 2 | 0 | 1 |
| 1 | 2 | 0 | 2 | 2 | 0 | 0 | 1 |
| 1 | 3 | 0 | 2 | 2 | 0 | 0 | 1 |
| 1 | 4 | 0 | 2 | 2 | 0 | 0 | 1 |
| 1 | 5 | 9 | 2 | 2 | 11 | 0 | 0 |
| 1 | 6 | 9 | 2 | 2 | 11 | 0 | 0 |
| 1 | 7 | 0 | 5 | 3 | 3 | 0 | 0 |
| 1 | 8 | 0 | 5 | 3 | 3 | 0 | 0 |
| 1 | 9 | 0 | 11 | 4 | 5 | 0 | 0 |
| 1 | 10 | 0 | 11 | 4 | 5 | 0 | 0 |
| 1 | 11 | 0 | 23 | 5 | 7 | 0 | 0 |
| 1 | 12 | 0 | 23 | 5 | 7 | 0 | 0 |
| 1 | 13 | 0 | 95 | 7 | 39 | 0 | 0 |
| 1 | 14 | 0 | 95 | 7 | 39 | 0 | 0 |
| 1 | 15 | 0 | 95 | 7 | 39 | 0 | 0 |
| 2 | 0 | 1 | 1 | 1 | 0 | 0 | 1 |
| 2 | 1 | 1 | 1 | 1 | 0 | 0 | 1 |
| 2 | 2 | 1 | 1 | 1 | 0 | 0 | 1 |
| 2 | 3 | 0 | 0 | 2 | 12 | 0 | 0 |
| 2 | 4 | 0 | 0 | 2 | 12 | 0 | 0 |
| 2 | 5 | 0 | 0 | 2 | 12 | 0 | 0 |
| 2 | 6 | 17 | 1 | 1 | 7 | 0 | 0 |
| 2 | 7 | 0 | 6 | 3 | 1 | 0 | 0 |

TABLE 4-continued

Excerpts from the Encoder Table

| Inputs | | ON LPS | | | ON MPS | | |
|---|---|---|---|---|---|---|---|
| State | Pclass | next_state | outbits | outsize | next_state | outbits | outsize |
| 2 | 8 | 0 | 6 | 3 | 1 | 0 | 0 |
| 2 | 9 | 0 | 6 | 3 | 1 | 0 | 0 |
| 2 | 10 | 0 | 13 | 4 | 8 | 0 | 0 |
| 2 | 11 | 0 | 13 | 4 | 8 | 0 | 0 |
| 2 | 12 | 0 | 27 | 5 | 18 | 0 | 0 |
| 2 | 13 | 0 | 55 | 6 | 30 | 0 | 0 |
| 2 | 14 | 0 | 55 | 6 | 30 | 0 | 0 |
| 2 | 15 | 0 | 55 | 6 | 30 | 0 | 0 |
| 3 | 0 | 10 | 0 | 0 | 1 | 0 | 1 |
| 3 | 1 | 10 | 0 | 0 | 1 | 0 | 1 |
| 3 | 2 | 10 | 0 | 0 | 1 | 0 | 1 |
| 3 | 3 | 10 | 0 | 0 | 1 | 0 | 1 |
| 3 | 4 | 0 | 4 | 3 | 0 | 0 | 1 |
| 3 | 5 | 0 | 4 | 3 | 0 | 0 | 1 |
| 3 | 6 | 0 | 4 | 3 | 0 | 0 | 1 |
| 3 | 7 | 0 | 4 | 3 | 0 | 0 | 1 |
| 3 | 8 | 0 | 4 | 3 | 0 | 0 | 1 |
| 3 | 9 | 0 | 9 | 4 | 11 | 0 | 0 |
| 3 | 10 | 0 | 9 | 4 | 11 | 0 | 0 |
| 3 | 11 | 0 | 19 | 5 | 15 | 0 | 0 |
| 3 | 12 | 0 | 39 | 6 | 25 | 0 | 0 |
| 3 | 13 | 0 | 39 | 6 | 25 | 0 | 0 |
| 3 | 14 | 0 | 39 | 6 | 25 | 0 | 0 |
| 3 | 15 | 0 | 39 | 6 | 25 | 0 | 0 |
| 4 | 0 | 2 | 1 | 1 | 0 | 0 | 1 |
| 4 | 1 | 2 | 1 | 1 | 0 | 0 | 1 |
| 4 | 2 | 2 | 1 | 1 | 0 | 0 | 1 |
| 4 | 3 | 1 | 3 | 2 | 1 | 0 | 0 |
| 4 | 4 | 1 | 3 | 2 | 1 | 0 | 0 |
| 4 | 5 | 1 | 3 | 2 | 1 | 0 | 0 |
| 4 | 6 | 1 | 3 | 2 | 1 | 0 | 0 |
| 4 | 7 | 1 | 3 | 2 | 1 | 0 | 0 |
| 4 | 8 | 1 | 3 | 2 | 1 | 0 | 0 |
| 4 | 9 | 0 | 14 | 4 | 2 | 0 | 0 |
| 4 | 10 | 0 | 14 | 4 | 2 | 0 | 0 |
| 4 | 11 | 0 | 14 | 4 | 2 | 0 | 0 |
| 4 | 12 | 0 | 29 | 5 | 55 | 0 | 0 |
| 4 | 13 | 0 | 29 | 5 | 55 | 0 | 0 |
| 4 | 14 | 0 | 29 | 5 | 55 | 0 | 0 |
| 4 | 15 | 0 | 29 | 5 | 55 | 0 | 0 |
| ... | ... | ... | ... | ... | ... | ... | ... |
| 59 | 0 | 15 | 1 | 1 | 0 | 0 | 1 |

FIG. 1C illustrates a block diagram of a finite state machine decoder. The context memory is exactly the same as for the encoder, as is the probability estimation table The entropy decoding table has a different set of inputs and outputs as discussed below. Referring to FIG. 1C, compressed bits 130 are received by a shift register 131, which provides compressed bits to the entropy encoding table 115. The entropy encoding table 115 also receives the channel state from the channel state storage area 106 and a pclass 118 from the probability estimation table 103. In response to these inputs, the entropy encoding table 115 generates an LPS 132, the next_state 119 (as in the encoder), and outsize 121.

The LPS 132 is coupled to one input of exclusive-OR (XOR) gate 137, which also receives the current MPS 114. Based on these two inputs, a bit 140 is output from the decoder.

The LPS 132 is also ANDed with the toggle_MPS 115 output of probability estimation table 103 by AND gate 136. The output of AND gate 136 is exclusive_ORed with the LPS 132 by XOR gate 138 to generate the next_pstate 112 indication that is an input to the context memory 101.

The LPS 132 is also used as a select signal for multiplexor (mux) 135 to output either the next_LPS signal 133 indicating the next LPS or the next_MPS signal 132 indicating the next MPS, which are output from the probability estimation table 103. The output of mux 135 is the next_MPS 111, which is an input to the context memory 101.

The outsize 121 is output from the entropy encoding table 115 to control the number of bits to shift the compressed bit stream to provide the next input to the entropy encoding table 115.

The decoder can be derived from the encoder using the code shown below. Given the encoder table of the form of Table 4 the function makedtable (table, 62, 16) will return a decoding table indexed by state, probability class and compressed bits (8 bits of the compressed data stream), in the form of Table 5.

Decoder Generation Code

```
typedef struct trans_struct
  short nxt; short out; short siz;
} TRANS;
typedef struct dtrans_struct {short nxt; char lik; char read;} DTRANS;
//Can the number of bits represented by "numbits" (equivalent to the
//low order bits of variable "bits" be output starting in state
//"state" with class "pclass" using encoder table "ttable"
//which has "num_class" different classes?
```

-continued

Decoder Generation Code

```
static int cando(Trans *ttable,
    int bits, int numbits,
    const int state,
    const int likely,
    const int pclass,
    const int num_class)
{
  int j, k, m;
  Trans *tp;
  int next;
  tp = ttable + (state*num_class*2) + (pclass<<1) + likely;
  j = tp->siz;
  K = tp->out;
  if (j > numbits) {
    k >>+ J - numbits;
    j = numbits
  }
  numbits -= j;
  m = bits >> numbits;
  bits &= (1 << numbits) - 1;
  if (m != k)    // NO! transition does wrong bits.
    return 0;
  if (numbits < 1) // YES! at least numbits match
    return 1;
  next = tp->nxt; // MAYBE depends on more bits
  //Might need to check more than one pclass some day
  return  cando (ttable, bits, numbits, next, 0, 0, num_class)
      || cando (ttable, bits, numbits, next, 1, 0, num_class);
}
/* Derive the Decoder table from the Encoder table */
DTRANS *makedtable(TRANS *ttable, int numstates, int numclass)
{
  int state, pclass, bitin;
  int canhi, canlo
  TRANS *tp
  int dp;
  int i;
  int maxbits = 0;// Find the max bits on a transition
  for (i=0; i<2*numstates*numclass; i++)
    if (ttable[i].siz>maxbits)
      maxbits = ttable [i] siz;
  DTRANS *dtable = new DTRANS
  [numstates*numclass<<maxbits];
  for (state = 0; state < numstates; state++)
    for (pclass = 0; pclass <numclass; pclass++)
      for (bitin = 0; bitin < (1<<maxbits); bitin++) {
        canhi = cando (ttable, bitin, maxbits, state, 1, pclass,
numclass);
        canlo = cando (ttable, bitin, maxbits, state, 0, pclass,
numclass);
        dp = ((state*numclass + pclass)<<maxbits) + bitin;
        if (canhi && canlo) {
          Abort ("Next trans not unique in state %d pclass %d
bits %d/n", state, pclass, bitin);
        } else if (canhi || canlo) {
          tp = ttable + (state*numclass*2) + (pclass<<1) + canhi;
          dtable [dp].nxt = tp->nxt;
          dtable [dp].lik = canhi;
          dtable [dp].read = tp->siz;
        }else{
          dtable [dp].nxt = -1; // Decoder could/should check for error
          dtable [dp].lik = -1;
          dtable [dp].read = -1;
        }
      }
  return dtable;
}
```

An excerpt for a decoder table is shown in Table 5 below.

TABLE 5

Part of the FSM Decoder Table

| State | Probability Class | Compressed Bits | Next State | Bit Decoded | Shift Bitstream |
|---|---|---|---|---|---|
| 0 | 0 | 0–127 | 0 | 0 | 1 |
|   |   | 128–256 | 0 | 1 | 1 |
|   | 1,2 | 0–159 | 3 | 1 | 0 |
|   |   | 160–255 | 9 | 0 | 1 |
|   | 3 | 0–175 | 5 | 1 | 0 |
|   |   | 176–255 | 41 | 0 | 1 |
|   | 4,5,6 | 0–191 | 1 | 1 | 0 |
|   |   | 192–255 | 0 | 0 | 2 |
|   | 7 | 0–207 | 8 | 1 | 0 |
|   |   | 208–255 | 9 | 0 | 2 |
|   | 8,9 | 0–223 | 2 | 1 | 0 |
|   |   | 224 | 0 | 0 | 3 |
|   | 10 | 0–231 | 55 | 1 | 0 |
|   |   | 232–255 | 9 | 0 | 3 |
|   | 11 | 0–239 | 4 | 1 | 0 |
|   |   | 240–255 | 0 | 0 | 4 |
|   | 12 | 0–247 | 6 | 1 | 0 |
|   |   | 248–255 | 0 | 0 | 5 |
|   | 13 | 0–251 | 16 | 1 | 0 |
|   |   | 252–255 | 0 | 0 | 6 |
|   | 14 | 0–253 | 27 | 1 | 0 |
|   |   | 244–255 | 0 | 0 | 7 |
|   | 15 | 0–254 | 56 | 1 | 0 |
|   |   | 255 | 0 | 0 | 8 |
| 1 | 0,1 | 0–111 | 2 | 1 | 1 |
|   |   | 112–191 | 17 | 0 | 0 |
|   |   | 192–255 |   | impossible |   |
|   | 2,3,4 | 0–127 | 0 | 1 | 1 |
|   |   | 128–191 | 0 | 0 | 2 |
|   |   | 192–255 |   | impossible |   |

Multiple Bits at Multiple Probabilities

An entropy encoding table may be constructed that accepts multiple bits (likely indications) and multiple probabilities (probability class) at a time. An example of such a table is shown in FIG. 2. Referring to FIG. 2, an entropy coding look-up table 205 is coupled to receive 16 input bits comprised of 6 bits of state information from state register 106, 4 bits representing a first probability class PClass1, one bit providing a first likely indication Likely1, four bits representing a second probability class PClass2, and one bit providing a second likely indication Likely2. The entropy coding table 205 outputs 27 bits comprised of 6 bits representing the next state which is fed back to state register 106, 16 output bits (OUTBITS) and five bits indicating the size of the output (OUTSIZE). Thus, the entropy coding table 205 encodes two bits at a time for any probabilities.

One problem with using a single table that can accommodate multiple bits for multiple probability classes at a time is that such a table becomes very large as the number of inputs increase. Also a very large table requires more bits to address the table, which reduces its speed.

Multiple Bits at Fixed Probability

The present invention provides an increase in speed for an encoder by sending multiple bits at a fixed probability to a single entropy encoding table. The fixed probability may comprise a probability class. However, each table that accommodates n bits (n≧2) inputs only accommodates one such class or probability. It should be noted that a table can be designed to accommodate different Pclasses, but requires accommodating an increased input size.

One example of a table that accommodates multiple bits at the same time is a table that handles bits which are at a probability of 0.5 (or 50 percent). FIG. 3 illustrates one embodiment of such an entropy encoding table. Referring to FIG. 3, the entropy encoding table 305 is coupled to receive 10 input bits comprised of 6 bits of state information from state register 306 along with four bits of input, Likely1–4, and outputs 21 bits comprised of six bits of next state information that is fed back to state register 306, eleven bits of output (OUTBITS) and four bits to indicate the size of the output (OUTSIZE). Thus, by using fixed probability, the size of the input and the output are reduced in comparison to the table of FIG. 2.

In another embodiment, the encoding table receives multiple inputs having a fixed probability that is highly skewed such as, for example, in the high 90 percent range (e.g., approximately 98, approximately 99 percent, etc.).

The FSM coder of the present invention may be incorporated into an encoding system such as shown in FIG. 1A. In one embodiment, the estimation state is updated only at pseudo-random intervals. By updating only at pseudo-random intervals, complete counts of all LPSs and MPSs do not have to be saved. In one embodiment, the estimation state is updated when the entropy encoding table 105 produces output bits. In one embodiment, the output size 122 may be compared to zero to determine when an output has occurred. This requires the table to include extra states to compensate for changes in probability that occur between updates. Likewise, the FSM decoder may also be incorporated into the decoder discussed in conjunction with FIG. 1A.

Table Creation

Tables for handling multiple bits at a time, as opposed to single bits one at a time, may be created by applying single bits and monitoring output bits and next states that occur when a one-bit-at-a-time table is used. Then new outputs can be created by concatenating the output bits from a series of states. The next state for the series is the next state created from the last output bits. This method will be made clear by the examples discussed below. The table is often larger and contains entries which may be determined by sending bits one at a time through the current entropy coder. That is, specific tables may be designed by using the finite state machine estimator/coder of FIG. 1A. By building multi-bit entropy coding tables in this manner, the present invention maintains the compatibility with binary coding tables and allows the tables to be switched at any point, even with fractional bits.

For example, an exemplary FSM encoder is represented in Table 6 below.

TABLE 6

FSM encoder

| Current State | Probability Class | Outcome | Next State | Output |
|---|---|---|---|---|
| 0 | 0 | MPS | 0 | 0 |
|  | 0 | LPS | 0 | 1 |
|  | 1 | MPS | 1 | — |
|  | 1 | LPS | 0 | 11 |
| 1 | 0 | MPS | 0 | 0 |
|  | 0 | LPS | 0 | 10 |
|  | 1 | MPS | 0 | 0 |
|  | 1 | LPS | 0 | 10 |

A 2-bit at time coder produces one next state and one output in response to inputs comprising the current state, two probability classes and two outcomes. To determine what the next state and the output should be, the from a one-bit-at-a-time coder and the final state after coding two bits are used. For instance, in the case of Table 1, suppose the one-bit-at-a-time coder is in state 0 and an MPS in class 1 is to be encoded followed by an MPS in class 0. The first bit causes the one-at-time coder to output no its and move to state 1. The second bit is coded in state 1 and causes a 0 bit to be output and a return to state 0. The output of the new table for this two bit input would be 0, resulting from concatenating the no bit associated with the first bit and the 0 bit output associated with the second bit. The new next state in the two-at-a-time coder would be state 0 for the two bit input. A new table that handles multiple (2) bits at a time created from the one-state FSM coder of Table 6 is shown in Table 7 below.

TABLE 7

| Current State | Probability Class | Outcome | Next State | Output |
|---|---|---|---|---|
| 0 | 00 | MPS/MPS | 0 | 0 |
|  |  | MPS/LPS | 0 | 1 |
|  |  | LPS/MPS | 1 | — |
|  |  | LPS/LPS | 0 | 11 |
|  | 01 | MPS/MPS | 0 | 0 |
|  |  | MPS/LPS | 0 | 10 |
|  |  | LPS/MPS | 0 | 0 |
|  |  | LPS/LPS | 0 | 10 |
|  | 10 | MPS/MPS | 0 | 0 |
|  |  | MPS/LPS | 0 | 1 |
|  |  | LPS/MPS | 1 | — |
|  |  | LPS/LPS | 0 | 11 |
|  | 11 | MPS/MPS | 0 | 0 |
|  |  | MPS/LPS | 0 | 1 |
|  |  | LPS/MPS | 1 | — |
|  |  | LPS/LPS | 0 | 11 |
| 1 | 00 | MPS/MPS | 0 | 0 |
|  |  | MPS/LPS | 0 | 1 |
|  |  | LPS/MPS | 1 | — |
|  |  | LPS/LPS | 0 | 11 |
|  | 01 | MPS/MPS | 0 | 0 |
|  |  | MPS/LPS | 0 | 10 |
|  |  | LPS/MPS | 0 | 0 |
|  |  | LPS/LPS | 0 | 10 |
|  | 10 | MPS/MPS | 0 | 0 |
|  |  | MPS/LPS | 0 | 1 |
|  |  | LPS/MPS | 1 | — |
|  |  | LPS/LPS | 0 | 11 |
|  | 11 | MPS/MPS | 0 | 0 |
|  |  | MPS/LPS | 0 | 1 |
|  |  | LPS/MPS | 1 | — |
|  |  | LPS/LPS | 0 | 11 |

An example of a 3-bit class 0 coder is shown in Table 8 below.

TABLE 8

3 Bit Class 0 Coder

| Current State | Outcome | Next State | Output |
|---|---|---|---|
| 0 | MMM | 0 | 000 |
|  | MML | 0 | 001 |
|  | MLM | 0 | 010 |
|  | MLL | 0 | 011 |
|  | LMM | 0 | 100 |
|  | LML | 0 | 101 |
|  | LLM | 0 | 110 |
|  | LLL | 0 | 111 |
| 1 | MMM | 0 | 000 |
|  | MML | 0 | 001 |
|  | MLM | 0 | 010 |
|  | MLL | 0 | 011 |
|  | LMM | 0 | 1000 |
|  | LML | 0 | 1001 |
|  | LLM | 0 | 1010 |
|  | LLL | 0 | 1011 |

It should be noted that the table creation method of the present invention may be used to create tables of various sized inputs. However, a state for each possible input bit combination is required.

It is often desirable to speed up tables, such as Table 7. However, to speed up a 64 state table having 16 probability classes to be four times as fast, the table would have to have $2^{26}$ entries, instead of the $2^{11}$ entries used by the single speed table, and is not practical in many situations.

M-ary Codes

Run Codes

In one embodiment, fast coding is provided for 50% bits (or 60% bits) and a Golumb or other start-step-stop codes using single bits and 50% bits. Such a code is described in Bell, Cleary, Witten, *Text Compression*. Table 9 illustrates an example start-step-stop code:

TABLE 9

| Integer | Code | Implied Probability |
|---------|------|---------------------|
| 0 | 1:0 | 0.25 |
| 1 | 1:1 | 0.25 |
| 2 | 0:000 | 0.0625 |
| 3 | 0:001 | 0.0625 |
| 4 | 0:010 | 0.0625 |
| 5 | 0:011 | 0.0625 |
| 6 | 0:100 | 0.0625 |
| 7 | 0:101 | 0.0625 |
| 8 | 0:110 | 0.0625 |
| 9 | 0:111 | 0.0625 |

A typical run length code is shown in Table 10. Referring to Table 10, this code is good for encoding run of zeros with probability of approximately 0.917.

TABLE 10

| Input Run | Runlength | Codeword |
|-----------|-----------|----------|
| MMMMMMMM | 8 | 0 |
| L | 0 | 1000 |
| ML | 1 | 1001 |
| MML | 2 | 1010 |
| MMML | 3 | 1011 |
| MMMML | 4 | 1100 |
| MMMMML | 5 | 1101 |
| MMMMMML | 6 | 1110 |
| MMMMMMML | 7 | 1111 |

With such a system, there are at most 2 table look-ups for up to 8 bits coded. In the present invention, the run code in Table 10 may be implemented using the FSM coding tables for 1 and 4 50% bits.

One embodiment of the code to implement the run coder is:

```
if (runlength == 8) {
    FSMCode_at_50 (0)
} else {
    FSMCode_4_bits_at_50 (runlength + 8);
}
```

If the maximum run length occurs (8 in this case) then only one bit is to be output. This is done by coding a 0 at a fixed probability of 50% (done by the function FSMCode_at_50). This coding will use approximately 1 bit but will maintain any fractional bits from previous operations. If a run less than the maximum occurs, then a 4 bit value must be encoded which starts with a 1. This is done using a 4 bit at a time look-up table which is access through the function FSMCode_4_bits_at_50. The 50 in the function name refers to the fact that these functions assume the probability is fixed at one half or 50%.

One embodiment of the code used to implement decoding is as follows:

```
if (FSMDecode_at_50()) {
    runlength = FSMDecode_3_bits_at_50();
} else
    runlength = 8;
}
```

The decoder doesn't know in advance if a 4 bit value or a one bit value needs to be decoded. So first it decodes 1 bit at 50% with the call FSMDecode_at_50 ( ). If this bit is a 1, then the encoder actually coded four bits to describe a run. The remaining three bits are decoded with the call FSMDecode_at50 ( ), and their value is the run length encoded. If the first decoded bit was a zero then the maximum run occurred and it is not necessary to decode any additional bits.

Huffman and Huffman-like Codes

The present invention provides a FSM coder that comprises a Huffman encoding table. The Huffman encoding table may be the only table of the FSM or may be one of multiple entropy encoding tables in the FSM. In one embodiment, the Huffman bits are 50% likely and they are being coded with a fixed 50% probability. This can provide a compression advantage over the Huffman-like codes. In one embodiment, the bits are skewed instead of 50%. Note that in this case, however, that compression performance wouldn't be better than the bit at a time method.

Suppose a run of highly skewed bits is to be coded. For example, bits are 98% likely to be 0 and the coder is to be configured to code runs of length 0–5, such as shown in Table 11.

TABLE 11

| | Possible Runs | Probability | Huffman Code |
|---|---------------|-------------|--------------|
| 5 | 00000 | 0.904 | 0 |
| 4 | 00001 | 0.0184 | 1000 |
| 3 | 0001 | 0.0188 | 1001 |
| 2 | 001 | 0.0192 | 110 |
| 1 | 01 | 0.0196 | 111 |
| 0 | 1 | 0.02 | 101 | where each branch of the Huffman tree should be approximately 98%, but the probability class might only allow for 90% skew efficiency. A Huffman tree with these probabilities is shown in FIG. 8. The Huffman code can be used to reduce or even minimize the number of binary decisions and to reduce the highly skewed probabilities. For example, instead of coding each bit at 93% skew, the first bit coded has (only) 90% skew. A FSM coder coding the Huffman outputs will be more efficient than Huffman or an FSM coder employing a one-bit-at-a-time table. Simply by using the 1-bit at a time FSM coder with true probabilities in FIG. 8 and recording the outcome, a four-bit-at-a-time table may be constructed.

Using the 2-state FSM where the pclass 0 is used for possibilities less than 0.618 and the Huffman tree of FIG. 8, Table 12 may be constructed. Table 10 runs better than the Huffman code because 80% of the time there will be two run lengths of 5 in a row and this will save 1 bit.

TABLE 12

| State | Run | Bits | Class | Output | State |
|-------|-----|------|-------|--------|-------|
| 0 | 0 | LML | 101 | 11011 | 0 |
| | 1 | LLM | 100 | 1100 1110 | 0 |

TABLE 12-continued

| State | Run | Bits | Class | Output | State |
|---|---|---|---|---|---|
|  | 2 | LLL | 100 | 1100 1111 | 0 |
|  | 3 | LMMM | 1010 | 1110 1100 | 0 |
|  | 4 | LMML | 1010 | 110 10 | 0 |
|  | 5 | M | 1 | — | 1 |
|  | 0 | MLML | 101 | 10011 | 0 |
|  | 1 | LLM | 100 | 1010 | 0 |
|  | 2 | LLL | 100 | 1011 | 0 |
|  | 3 | LMMM | 1010 | 1000 | 0 |
|  | 4 | LMML | 1010 | 10010 | 0 |
|  | 5 | M | 1 | 0 | 0 |

FIG. 4 illustrates one embodiment of a multi-symbol entropy coding table which may be used to perform coding such as Huffman or run coding.Referring to FIG. 4, an entropy coding table 405 is coupled to receive a 14-bit input comprised of 6 bits of state information from state register 406 and 8 bits of a symbol or run count. The 8 bits might indicate any ascii character or a run length from 0 to 255. In response, the entropy encoding table 405 outputs 25 bits comprised of 6 bits of state information to state register 406 representing the next state. The entropy encoding table 405 also outputs 15 bits of output (OUTBITS) and four bits to indicate the size of the output (OUTSIZE).

An Entropy Encoding Table with Multiple Tables

The present invention provides various subsets of a larger speed up table which are useful. That is, in one embodiment, the n-bit-at-a-time entropy coding table is only one of a number of look-up tables employed by the entropy encoding FSM. The FSM may employ multiple tables designed to accommodate different number of bits (2 or greater) for individual fixed probabilities. A system may include a one-at-a-time table and a table to code several bits with the same probability. In this way, several bits are coded with the same probability, such as for instance, when the probability is 50% or very highly skewed (e.g., 99%). A special table for any fixed probability or even fixed pattern of probabilities could easily be created (e.g., one 50% bit, then one 99% bit, then two 60% bits).

In one embodiment, the present invention uses a one-bit-at-a-time LUT in conjunction with one or more fixed probability n-bit-at-a-time LUTs to encode wavelet coefficients. The two least significant bits of wavelet coefficients are typically fifty percent random being 1 or 0 (i.e., the probabilities close to 0.5). The present invention uses a LUT that encodes four bits at a time with a probability of 50%. The head bits in the coefficient, which are described in Edward L. Schwartz, Ahamd Zandi, Martin Boliek, "Implementation of Compression with Reversible Embedded Wavelets," Proc. of SPIE 40th Annual Meeting, Vol. 2564, San Diego, Calif., July 1995, are highly skewed, at approximately 99% zeros. A separate LUT accommodates multiple head bits at a time.

When using multiple tables to implement the FSM encoder, the present invention maintains the same channel state as an input to all the tables. In one embodiment, single channel state register outputs the same state information as an input to all of the tables. In one embodiment, the next state output from the table being used is fed back to the channel state registers for all tables. Note that this requires all of the tables to have the same states. Control logic may be used to control which table is accessed based on the inputs by switching between tables. The control logic may comprise a match response to the inputs. In another embodiment, all the tables are accessed each time, however, the output of all of the tables are multiplexed. In this case, control logic selects only one set of inputs as the outputs of the FSM coder. By using the same channel state for each of the tables, no fractional bits are lost when switching between coders.

In one embodiment, where head bit and the least significant bits of coefficients (tail bits) are encoded with a n-bit (n>2) table, a one-bit-at-a-time table may be used for those bits in between the head and tail bits.

Note that such tables are not exceedingly large because the number of bits needed to represent the probability (e.g., 4 bits) does not change for each of the input bits. The probability need only be sent once, instead of with each bit to be encoded.

Similar to that discussed above, the multi-symbol table of FIG. 4 may be one of multiple tables employed by the FSM coder. FIG. 5 illustrates an encoder that is capable of doing the same operation as in FIG. 1A,(a 1-bit-at-a-time FSM table), 3 (a 4-bit-at-a-time FSM table operating at a fixed 50% probability) and 4 (a Huffman code FSM table) by using two additional bits as a table selector. The remainder of the bits would remain the same as used in the previous table. The input and output sizes are determined based on the maximum size required by the sub tables (plus the selector bits). Referring to FIG. 5, the entropy encoding table 505 receives 18 bits of input comprised of six state information bits, the two bit table selector and the 10 table specific bits. For runcoding these might be a run length, four of them could be 4 50% bits, etc. The entropy encoding table 505 outputs 27 bits that comprise 6 state information bits that are fed back to state register 506, 16 output bits (OUTBITS), and 5 bits indicating the size of the output (OUTSIZE).

Combining Tables

In one embodiment, the number of tables in a system, such as the tables in FIG. 1A, may be reduced by combining tables. Since the estimation state update table has an output that is used as an input to the entropy coding state table, the inputs and outputs of these two tables can be combined. The integration of the FSM and the probability estimation machine (PEM) provide a speed improvement when coding 1 bit at a time.

One embodiment having this combined table is shown in FIG. 6. Referring to FIG. 6, a context memory 101 is coupled to receive a context 110 from a context model (not shown to avoid obscuring the present invention) and a next_npstate indication 612. As described above, the next npstate indication 612 provides an indication to the context memory 101 as to what the next probability estimation state is. Based on these inputs, the context memory 101 is accessed and outputs the current probability state (npstate) 613.

The joint probability estimation and entropy encoding table 603 is coupled to receive the npstate 613, the current bit 616, and an output of channel state 606. The output of the channel state 606 is in response to a next state (next_state) indication, output from the joint probability estimation and entropy encoding table 601. Based on its inputs, the joint probability estimation and entropy encoding table 601 generates output bits, shown as outbits 121, and an indication of the output size, shown as outsize 122. The joint probability estimation and entropy encoding table 601 also generates the next_npstate indication 612, indicating the next probability estimation state.

One embodiment of the joint probability estimation and entropy encoding table 601 is shown below in Table 13.

TABLE 13

Joint Probability Estimation and Entropy Coding Table

| Channel State | NPSTATE | BIT | Next Channel State | Next NPSTATE | OUTPUT |
|---|---|---|---|---|---|
| 0 | 0 | 0 | 0 | 2 | 0 |
|   | 0 | 1 | 0 | 1 | 1 |
|   | 1 | 0 | 0 | 0 | 1 |
|   | 1 | 1 | 0 | 3 | 0 |
|   | 2 | 0 | 0 | 4 | 0 |
|   | 2 | 1 | 0 | 0 | 1 |
|   | 3 | 0 | 0 | 1 | 1 |
|   | 3 | 1 | 0 | 5 | 0 |
|   | 4 | 0 | 1 | 6 | — |
|   | 4 | 1 | 0 | 2 | 11 |
|   | 5 | 0 | 0 | 3 | 11 |
|   | 5 | 1 | 1 | 7 | — |
|   | 6 | 0 | 1 | 6 | — |
|   | 6 | 1 | 0 | 4 | 11 |
|   | 7 | 0 | 0 | 5 | 11 |
|   | 7 | 1 | 1 | 7 | — |
| 1 | 0 | 0 | 0 | 2 | 0 |
|   | 0 | 1 | 0 | 1 | 10 |
|   | 1 | 0 | 0 | 0 | 10 |
|   | 1 | 1 | 0 | 3 | 0 |
|   | 2 | 0 | 0 | 4 | 0 |
|   | 2 | 1 | 0 | 0 | 10 |
|   | 3 | 0 | 0 | 1 | 10 |
|   | 3 | 1 | 0 | 5 | 0 |
|   | 4 | 0 | 0 | 6 | 0 |
|   | 4 | 1 | 0 | 2 | 10 |
|   | 5 | 0 | 0 | 3 | 10 |
|   | 5 | 1 | 0 | 7 | 0 |
|   | 6 | 0 | 0 | 6 | 0 |
|   | 6 | 1 | 0 | 4 | 10 |
|   | 7 | 0 | 0 | 5 | 10 |
|   | 7 | 1 | 0 | 7 | 0 |

The decoder table is different since the encoder and decoder coder tables are different. For instance, the decoder includes the following inputs. A compressed_bits representing the compressed bit stream, a channel_state input representing the channel state, and a pstate input representing the probability estimation state. The outputs of the decoder include the following: a shift_amount indicating an amount to shift the input compressed bit stream, a MPS indication, a new_pstate indicating the next probability instruction state and a next_state indication representing the new probability estimation state.

For a pseudo-random probability estimation table, the joint table encoder is of a feasible size. Use of a single table can save some computation time at a cost in memory.

FIG. 7 illustrates an alternate embodiment of a coder in which the probability state contains the MPS. Using this embodiment provides a computational improvement with less memory cost than the one table method described in conjunction with FIG. 6. This embodiment requires an estimation table twice as large as the estimation table discussed above with respect to FIG. 1A, but eliminates the need of the comparison and the exclusive-or (XOR).

Referring to FIG. 7, a context memory 101 is coupled to receive a context 110 and a next_npstate indicator 712. The next_npstate indication 712 provides an indication to the context memory 101 as to what the next probability estimation state is and also contains the MPS. Based on these inputs, the context memory 101 is accessed and outputs the current probability state (npstate) 713.

The probability estimation table 703 is coupled to receive the pstate 713 and the current bit 116 and, based on these inputs, outputs a probability class (pclass) 718. One embodiment of the probability estimation table is shown in Table 14 below:

TABLE 14

PEM with XOR and compare included

| NPSTATE | BIT | NEXT NPSTATE | NPCLASS |
|---|---|---|---|
| 0 | 0 | 2 | 1 |
| 0 | 1 | 1 | 0 |
| 1 | 0 | 0 | 0 |
| 1 | 1 | 3 | 1 |
| 2 | 0 | 4 | 1 |
| 2 | 1 | 0 | 0 |
| 3 | 0 | 1 | 0 |
| 3 | 1 | 5 | 1 |
| 4 | 0 | 6 | 3 |
| 4 | 1 | 2 | 2 |
| 5 | 0 | 3 | 2 |
| 5 | 1 | 7 | 3 |
| 6 | 0 | 6 | 3 |
| 6 | 1 | 4 | 2 |
| 7 | 0 | 5 | 2 |
| 7 | 1 | 7 | 3 |

The entropy encoding table 705 is coupled to receive the pclass 718 and an output of channel state 106. The output of the channel state 106 is in response to a next state indication, next_state 119, output from the entropy encoding table 705. Based on its inputs, the entropy encoding table 705 generates outputs bits, shown as outbits 121, and an indication of the output size, shown as outsize 122.

In software, it is reasonable to combine a one bit fixed field with a nine bit field, so the context memory 101 can be reduced from 4 bytes per context (2 bytes estimation state + 1 byte MPS indication + one byte padding) to 2 bytes per context.

System Applications

The entropy coder described here can be used within a variety of compression systems. For example, the entropy coder could be used in the JPEG system. In one embodiment, the FSM coder and probability estimation may replace the QM-coder from the standard JPEG system. This replacement would probably only benefit from the combined estimation and entropy coding tables. An alternative embodiment could replace the Huffman code from the JPEG standard with the M-ary version of the FSM described here. In fact, the JPEG standard uses "mantissa" and "make-up bits" in the codes. The "mantissa" bits could be encoded by the M-ary FSM, and the "make-up" bits could be coded by the fixed N at a time 50% bit table.

Likewise, the entropy coder could be used with the CREW wavelet compression system, such as described in Edward L. Schwartz, Ahmad Zandi, Martin Boliek, "Implementation of Compression with Reversible Embedded Wavelets," Proc. of SPIE 40th Annual Meeting, vol. 2564, San Diego, Calif., July 1995. In the CREW system there are head bits which are very likely to be 0. These head bits could be code using a fixed probability of, for example, 95% by an n-bit at a time FSM coder. Similarly, many of the "tail" bits are equally likely to be 0 or 1 and could be coded using an n-bit at a time FSM coder for 50% probability. There are several ways the coding of head or tail bits may be done. For example, 4 tail bits from a single coefficient could be encoded together. Alternatively, the 4 least significant bits from four different coefficients could be coded together. There are many other possibilities that will be apparent to one skilled in the art. Clearly, other wavelet image compression systems, and even textual or sound compression systems can make use of the various coding possibilities of the FSM coder of the present invention.

Whereas many alterations and modifications of the present invention will no doubt become apparent to a person of ordinary skill in the art after having read the foregoing description, it is to be understood that the particular embodiment shown and described by way of illustration is in no way intended to be considered limiting. Therefore, references to details of the preferred embodiment are not intended to limit the scope of the claims which in themselves recite only those features regarded as essential to the invention.

We claim:

1. An encoder for encoding data inputs, said encoder comprising:
   a channel state storage device; and
   an entropy encoding table coupled to receive state information from the channel state storage device and encode n bits of the input data at a time in response to the state information, where n is greater than or equal to two.

2. The encoder defined in claim 1 wherein the entropy encoding table encodes n bits at a fixed probability.

3. The encoder defined in claim 1 where the n bits comprise a symbol.

4. The encoder defined in claim 1 where the entropy encoding table performs Huffman coding.

5. The encoder defined in claim 1 wherein the entropy encoding table performs run length encoding.

6. The encoder defined in claim 1 wherein said the entropy encoding table encodes least significant bits of coefficients.

7. The encoder defined in claim 1 wherein the entropy encoding table encodes head bits of coefficients in the data input.

8. A system for encoding input data, said system comprising:
   a context model to generate a series of binary decisions in response to contexts;
   a probability estimation model coupled to the context model to generate probability estimates for the series of binary decisions;
   a channel state storage device; and
   a plurality of entropy encoding tables coupled to received state information from the channel state storage and encode bits of the series of binary decisions in response to the state information, wherein one of the plurality of entropy encoding tables encodes n bits at a time, where n is greater than or equal to two.

9. The system defined in claim 8 wherein said one of the plurality of entropy encoding tables encodes n bits at a fixed probability.

10. The system defined in claim 8 wherein said one of the plurality of entropy encoding tables perform Huffman coding.

11. The system defined in claim 8 wherein said one of the plurality of entropy encoding tables perform run length encoding.

12. The system defined in claim 8 wherein said one of the plurality of entropy encoding tables encodes least significant bits of coefficient tails.

13. The system defined in claim 8 wherein said one of the plurality of entropy encoding tables encodes head bits of coefficients in the data input.

14. The system defined in claim 8 at least one of the plurality of entropy encoding tables comprises a joint probability estimation and entropy encoding table.

15. The system defined in claim 8 further comprising a switch configured to select individual tables of the plurality of entropy encoding tables to encode one or more bits of the input data based on the probability.

16. The system defined in claim 8 wherein the probability estimation model comprises a table.

17. The system defined in claim 16 wherein the context model provides a probability state indication having a most probable symbol (MPS) indication therein.

18. An encoder for encoding data inputs, said encoder comprising:
   a context memory to generate a next probability state in response to a context;
   a channel state storage device; and
   a joint probability estimation and entropy encoding table coupled to receive the next probability state from the context memory, to receive state information from the channel state storage device and to receive bits of the input data, the table encoding bits of the input data in response to the state information.

19. The encoder defined in claim 18 wherein the entropy encoding table encodes n bits at a fixed probability.

20. The encoder defined in claim 18 where the n bits comprise a symbol.

21. The encoder defined in claim 18 where the entropy encoding table performs Huffman coding.

22. The encoder defined in claim 18 wherein the entropy encoding table performs run length encoding.

23. The encoder defined in claim 8 wherein the entropy encoding table encodes least significant bits of coefficients.

24. The encoder defined in claim 1 wherein the entropy encoding table generates a next state that is fed back to the channel state storage device for use as an input to the entropy encoding table in the future.

25. The encoder defined in claim 2 wherein the fixed probability comprises a probability class.

26. The encoder defined in claim 2 wherein the fixed probability comprises a probability of approximately 50%.

27. The encoder defined in claim 2 wherein the fixed probability comprises a highly skewed probability.

28. The encoder defined in claim 1 wherein the n bits comprise run length codes.

29. The encoder defined in claim 1 wherein the n bits comprise start-step-stop codes.

30. The encoder defined in claim 1 further comprising an entropy decoding table to decode the encoded bits from the entropy encoding table.

31. The system defined in claim 8 wherein the estimation state is updated at only pseudo-random intervals.

32. The system defined in claim 31 wherein the pseudo-random intervals occur when outputs are produced by the plurality of entropy encoding tables.

33. The encoder defined in claim 8 wherein the entropy encoding table generates a next state that is fed back to the channel state storage device for use as an input to the entropy encoding table in the future.

34. The encoder defined in claim 9 wherein the fixed probability comprises a probability class.

35. The encoder defined in claim 9 wherein the fixed probability comprises a probability of approximately 50%.

36. The encoder defined in claim 9 wherein the fixed probability comprises a highly skewed probability.

37. The encoder defined in claim 8 wherein the n bits comprise run length codes.

38. The encoder defined in claim 8 wherein the n bits comprise start-step-stop codes.

39. The system defined in claim 8 wherein the plurality of entropy encoding tables comprises a first plurality of entropy encoding tables that individually encode at least n bits of the input data at a time and an entropy encoding table to encode 1-bit inputs at a time.

40. The system defined in claim 8 wherein the plurality of entropy encoding tables comprises a first plurality of entropy encoding tables that individually encode at least n bits of the input data at a time, and further wherein each of the plurality of n-bit input entropy encoding tables is associated with a distinct fixed probability.

41. The system defined in claim 8 wherein the plurality of entropy encoding tables comprises a first plurality of entropy encoding tables, that individually encode at least n bits of the input data at a time and further wherein each of the plurality of n-bit input entropy encoding tables is associated with a distinct fixed pattern of probabilities.

42. The system defined in claim 8 wherein the plurality of entropy encoding tables further comprises a table selection input to select an individual one of the plurality of entropy encoding tables.

43. The system defined in claim 8 wherein each of the plurality of entropy encoding tables is enabled to generate outputs for each input received by the plurality of entropy encoding tables, and further comprising a multiplexor coupled to the outputs of each of the plurality of entropy encoding tables to select an output from one of the plurality of entropy encoding tables.

44. The system defined in claim 8 further comprising control logic coupled to the plurality of entropy encoding tables to control access to the plurality of entropy encoding tables by switching between tables.

45. The system defined in claim 8 further comprising an entropy decoding table to decode the encoded bits from the one entropy encoding table.

46. The system defined in claim 8 wherein the probability estimation model contains an MPS reach probability estimation state.

47. The encoder defined in claim 18 wherein the probability state of the joint probability estimation entropy encoding table contains the most probable symbol (MPS).

48. A method for encoding input data comprising the steps of:
    storing channel state information in a state register; and
    encoding n bits of the input data at a time, using an M-ary finite state machine (FSM) entropy encoding table, in response to the state information, where n is greater than or equal to two.

49. The method defined in Clam 48 further comprising the steps of:
    generating a series of binary decisions in response to contexts,
    generating probability estimates for the series of binary decisions, wherein the series of binary decisions are encoded with the plurality of entropy encoding tables.

50. The method defined in claim 48 wherein the input data comprises run length codes.

51. The method defined in claim 48 wherein the input data comprises start-step-stop codes.

52. The method defined in claim 48 further comprising the step of receiving a probability class in response to a probability estimate and indication of whether inputs are in their likely state, when the input data is encoded based on the probability class.

53. The method defined in claim 48 further comprising the step of generating the next state that is fed back to the state register for use as an input in the next set of n bits being encoded.

54. The method defined in claim 48 further comprising the steps of selecting a 1-bit FSM entropy encoding table for encoding 1-bit inputs of the input data based on a probability estimate.

55. An apparatus for encoding input data comprising:
    means for generating probability estimation;
    means for storing a channel state information;
    means for encoding n bits of the input data at a time, using an M-ary finite state machine (FSM) entropy encoding table, in response to the channel state information and the probability estimation, where n is greater than or equal to two.

56. The apparatus defined in claim 55 wherein the probability estimation comprises a probability class.

57. The apparatus defined in claim 55 further comprising means for generating a probability class.

58. The apparatus defined in claim 55 further comprising the M-ary FSM encoding table generating a next state and feeding the next state back to the means for storing the channel state information.

59. The apparatus defined in claim 55 wherein the input data comprises run length codes.

60. The apparatus defined in claim 55 further comprising an entropy decoding table to decode the encoded bits from the M-ary FSM entropy encoding table.

61. An encoder for encoding data inputs, said encoder comprising:
    means for generating a next probability state in response to a context;
    means for stating the channel state; and
    means for entropy encoding comprising a joint probability estimation and entropy encoding table coupled to receive the next probability state from the context memory, to receive state information from the channel state storage device and to receive bits of the input data, the table encoding bits of the input data in response to the state information.

62. The encoder defined in claim 61 where the entropy encoding table performs Huffman coding.

63. The encoder defined in claim 61 wherein the entropy encoding table performs run length encoding.

64. The encoder defined in claim 61 wherein the entropy encoding table encodes least significant bits of coefficients.

65. The encoder defined in claim 61 wherein the probability state of the joint probability estimation entropy encoding table contains the most probable symbol (MPS).

66. A computer software product comprising a computer readable medium having instructions stored thereon, which when executed by a processor, cause the processor to:
    store channel state information in a state register; and
    encode n bits of the input data at a time, using an M-ary finite state machine (FSM) entropy encoding table, in response to the state information, where n is greater than or equal to two.

67. A decoder comprising:
    a shift register coupled to receive compressed bits generated by an entropy encoding table that encodes n bits of input data at a time, where n is greater than or equal to two;
    a state storage device to store the channel state;
    an entropy encoding table coupled to receive state information from the state storage device and compressed bits from the shift register to decode the compressed bits in response to the state information.

68. The decoder defined in claim 67 wherein the entropy encoding table generates an output size that is coupled to control the shift register.

69. The decoder defined in claim 67 wherein the entropy encoding table generates the next state that is fed back to the state storage device for use in decoding the next one or more bits of the compressed data.

70. The decoder defined in claim 67 further comprising a probability estimation table coupled to provide a probability estimation indication to the entropy encoding table.

71. The decoder defined in claim 67 further comprising an XOR gate, wherein the entropy encoding table generates a least probable symbol (LPS) indication that is XORed by the XOR gate with the most probable symbol (MPS) for the current probability estimation state to generate one or more bits.

72. The decoder defined in claim 71 further comprising a context memory coupled to provide a probability estimation state to the probability estimation table in response to a context, the context memory also indicating the MPS for the context.

73. The decoder defined in claim 67 further comprising a multiplexor coupled to receive inputs of the next LPS and next MPS from the probability estimation table, the mux outputting an indication of the next MPS in response to the LPS output from the entropy encoding table selecting between the next LPS and next MPS inputs to the mux.

74. The decoder defined in claim 67 wherein the state storage device is coupled to input the state information to each of the plurality of entropy encoding tables.

* * * * *